United States Patent
Sato et al.

(10) Patent No.: US 9,988,702 B2
(45) Date of Patent: Jun. 5, 2018

(54) COMPONENT FOR PLASMA PROCESSING APPARATUS AND METHOD FOR MANUFACTURING COMPONENT FOR PLASMA PROCESSING APPARATUS

(71) Applicants: KABUSHIKI KAISHA TOSHIBA, Tokyo (JP); TOSHIBA MATERIALS CO., LTD., Yokohama-Shi, Kanagawa-Ken (JP)

(72) Inventors: Michio Sato, Kanagawa (JP); Takashi Hino, Kanagawa (JP); Masashi Nakatani, Kanagawa (JP)

(73) Assignees: Kabushiki Kaisha Toshiba, Tokyo (JP); Toshiba Materials Co., Ltd., Kanagawa-Ken (JP)

( * ) Notice: Subject to any disclaimer, the term of this patent is extended or adjusted under 35 U.S.C. 154(b) by 595 days.

(21) Appl. No.: 14/402,523

(22) PCT Filed: May 22, 2013

(86) PCT No.: PCT/JP2013/064186
§ 371 (c)(1),
(2) Date: Nov. 20, 2014

(87) PCT Pub. No.: WO2013/176168
PCT Pub. Date: Nov. 28, 2013

(65) Prior Publication Data
US 2015/0152540 A1    Jun. 4, 2015

(30) Foreign Application Priority Data
May 22, 2012   (JP) ................................. 2012-117028

(51) Int. Cl.
C23C 4/12     (2016.01)
C23C 28/04    (2006.01)
(Continued)

(52) U.S. Cl.
CPC ................ *C23C 4/12* (2013.01); *C23C 24/04* (2013.01); *C23C 28/042* (2013.01);
(Continued)

(58) Field of Classification Search
CPC ......... C23C 4/12; C23C 28/042; C23C 24/04; H01J 37/32477; Y10T 428/26; Y10T 428/24413
See application file for complete search history.

(56) References Cited

U.S. PATENT DOCUMENTS

| 7,648,782 B2 | 1/2010 | Kobayashi et al. |
| 8,007,899 B2 | 8/2011 | Freling et al. |

(Continued)

FOREIGN PATENT DOCUMENTS

| JP | 2001-164354 A | 6/2001 |
| JP | 2004-002101 A | 1/2004 |

(Continued)

OTHER PUBLICATIONS

Clemens J. M. Lasance, May 1, 1999, The thermal conductivity of aluminum oxide,Ceramics, Design, Materials, Compounds, Adhesives, Substrates, No. 2, Technical Data, Test & Measurement, vol. 5.*

(Continued)

*Primary Examiner* — Nathan L Van Sell
(74) *Attorney, Agent, or Firm* — Harness, Dickey & Pierce, PLC

(57) ABSTRACT

The present invention provides a component for a plasma processing apparatus, the component comprising: a base material; an underlayer covering a surface of the base material; and an yttrium oxide film covering a surface of the underlayer, wherein the underlayer comprises a metal oxide film having a thermal conductivity of 35 W/m·K or less, the yttrium oxide film contains at least either particulate por- (Continued)

tions made of yttrium oxide or non-particulate portions made of yttrium oxide, the particulate portions being portions where a grain boundary demarcating an outer portion of the grain boundary is observed under a microscope, and the non-particulate portions being portions where the grain boundary is not observed under a microscope, the yttrium oxide film has a film thickness of 10 μm or more and a film density of 96% or more, and when a surface of the yttrium oxide film is observed under a microscope, an area coverage ratio of the particulate portions is 0 to 20% in an observation range of 20 μm×20 μm and an area coverage ratio of the non-particulate portions is 80 to 100% in the observation range.

5 Claims, 2 Drawing Sheets

(51) Int. Cl.
    *C23C 24/04*     (2006.01)
    *H01J 37/32*     (2006.01)

(52) U.S. Cl.
    CPC . *H01J 37/32477* (2013.01); *Y10T 428/24413* (2015.01); *Y10T 428/26* (2015.01)

(56) References Cited

U.S. PATENT DOCUMENTS 9,236,229 B2     1/2016     Eto et al.

| | | | |
|---|---|---|---|
| 2002/0177001 | A1 | 11/2002 | Harada et al. |
| 2004/0002221 | A1 | 1/2004 | O'Donnell et al. |
| 2009/0233126 | A1* | 9/2009 | Iwasawa ............ C23C 24/04 428/702 |

FOREIGN PATENT DOCUMENTS

| | | |
|---|---|---|
| JP | 2005-158933 A | 6/2005 |
| JP | 2006-089338 A | 4/2006 |
| JP | 2006-108178 A | 4/2006 |
| JP | 2008-095193 A | 4/2008 |
| JP | 4084689 B2 | 4/2008 |
| JP | 2009-293061 A | 12/2009 |
| JP | 2010-283361 A | 12/2010 |
| JP | A2012-060101 | 3/2012 |
| KR | 10-2007-0095211 A | 9/2007 |
| KR | 10-1108692 B | 1/2012 |

OTHER PUBLICATIONS

Abu-Eishah, Samir I., Jan. 2006, Correlations for the Thermal Conductivity of Metal Oxides, Ceramic and Insulating Materials as a Function of Temperature, Proceedings of the 2nd International Conference on Thermal Engineering Theory and Applications, Jan. 3-6, 2006, Al Ain, United Arab Emirates.*

International Preliminary Report on Patentability dated Nov. 25, 2014 for corresponding PCT Patent Application No. PCT/JP2013/064186 (with English translation).

International Search Report (in Japanese with English translation) for PCT/JP2013/064186, dated Aug. 20, 2013; ISA/JP.

* cited by examiner

COMPONENT FOR PLASMA PROCESSING APPARATUS AND METHOD FOR MANUFACTURING COMPONENT FOR PLASMA PROCESSING APPARATUS

CROSS-REFERENCE TO RELATED APPLICATIONS

This application is a 371 U.S. National Stage of International Application No. PCT/JP2013/064186, filed on May 22, 2013, which claims priority to Japanese Patent Application No. 2012-117028, filed on May 22, 2012. The entire disclosures of the above applications are incorporated herein by reference.

TECHNICAL FIELD

The present invention relates to a component for a plasma processing apparatus and a method for manufacturing the component for a plasma processing apparatus.

BACKGROUND ART

Micro-interconnects (micro-wirings) in the manufacture of semiconductor apparatuses are usually formed by utilizing film deposition of an insulating film such as $SiO_2$ by a sputtering apparatus or CVD apparatus and isotropic or anisotropic etching of Si or $SiO_2$ by an etching apparatus. Generally, these apparatuses utilize a plasma discharge to improve film deposition rate and etching performance. For example, a plasma etching apparatus is used as an etching apparatus.

As a dry etching process which uses a plasma etching apparatus, for example, a method is known which conducts plasma etching for micro-fabrication of Si and a dry etching process of various thin films such as an insulating film, an electrode film and a wiring film deposited on a substrate during manufacture of a semiconductor.

Plasma etching is conducted as follows for example. First, a plurality of Si substrates are mounted on a surface of a lower electrode of upper and lower electrodes arranged so as to face each other in a chamber of a dry etching apparatus. Next, fluorine (F)-based gas such as $CF_4$ or chlorine (Cl)-based gas such as $Cl_2$ is introduced between the mounted substrates, and a plasma discharge is conducted between the electrodes to generate fluorine-based plasma or chlorine-based plasma. Then, the thin films formed on the substrates is dry-etched with active ions and radicals produced in the generated plasma to finish the process of plasma etching.

When thin films made of $SiO_2$, $Si_3N_4$, Poly-Si and the like on a Si substrate are plasma-etched, plasma components and a material to be etched react with each other to produce reaction products such as $SiF_4$ and fluorocarbons. Most of the reaction products are discharged out of the chamber in a gaseous state by an exhaust pump, and part of the reaction products is deposited in the chamber in a solid state to form adherent films. It is preferable that the adherent films made of reaction products are removed.

Therefore, a process has been known which discharges the reaction products (adherent films) adhering to an inside of the chamber out of the chamber by conducting dry etching using fluorine-based plasma or chlorine-based plasma in order to remove the reaction products. The dry etching, which is a process intended to remove the reaction products (adherent films), is performed by generating fluorine-based plasma or chlorine-based plasma under gas conditions different from those for dry etching of the thin films and the like described above.

However, when the reaction products constituting the adherent films are fluorocarbon-based etching products, the reaction products do not react sufficiently with fluorine-based plasma or chlorine-based plasma, and therefore the reaction products remain in the chamber. Therefore, when the remaining adherent films peel off and get mixed in the substrate, this could cause pattern defects or reduce yields.

Thus, conventionally, with respect to those components of the plasma etching apparatus which are irradiated with plasma, including the chamber, a film with high plasma resistance and corrosion resistance is formed on a surface of a base material to prevent production of reaction products. As such films, a film made of an yttrium oxide ($Y_2O_3$) and a film made of aluminum oxide ($Al_2O_3$) are known. These films are effective in curbing generation of reaction products and preventing component damage caused by plasma attacks.

For example, Japanese Patent No. 4084689 Specification (Patent Document 1) describes an $Y_2O_3$ film obtained by heat-treating a $Y(OH)_3$ sol solution applied to a base material, and Japanese Patent Laid-Open No. 2006-108178 (Patent Document 2) describes an $Al_2O_3$ thermally sprayed film.

PRIOR ART DOCUMENTS

Patent Document

Patent Document 1: Japanese Patent No. 4084689 Specification
Patent Document 2: Japanese Patent Laid-Open No. 2006-108178

SUMMARY OF THE INVENTION

Problems to be Solved by the Invention

However, a thermally sprayed film of an yttrium oxide or aluminum oxide formed by a thermal spraying method is a film made of deposited flat yttrium oxide or aluminum oxide particles, and such flat yttrium oxide or aluminum oxide particles are produced by processes in which molten yttrium oxide or aluminum oxide particles are collided with the surface of a base material and then cooled. Therefore, the thermally sprayed film of yttrium oxide or aluminum oxide formed by the thermal spraying method is liable to suffer from a large number of microcracks and remaining strains.

That is, when the yttrium oxide or aluminum oxide particles molten by a thermal spray heat source are rapidly cooled and solidified into flat shapes by colliding with the surface of the base material, microcracks occur on surfaces of the flat particles, and strains remain in the flat particles.

When such yttrium oxide or aluminum oxide film is irradiated with active radicals generated by a plasma discharge, the microcracks are attacked and expanded by the active radicals, and then the microcracks propagate the film when the internal strains are released. As a result thereof, the thermally sprayed film is liable to chip to thereby generate particles deriving from the thermally sprayed film, and at the same time, the reaction products adhering to the thermally sprayed film are liable to peel off to thereby generate particles deriving from the reaction products.

Further, the generation of particles reduces production yields of semiconductor apparatus and the like and increases cleaning and replacement frequencies of components for a plasma etching apparatus. Thus, the generation of particles reduces productivity and increases film deposition cost.

Further, when a thermally sprayed film is formed by plasma spraying which uses plasma as a heat source, oxide powder as powder supplied to the plasma has a particle diameter as large as about 10 to about 45 μm. Therefore, voids (pores) occur in the formed thermally sprayed film as much as up to about 15%, and the formed thermally sprayed film has a surface roughness of the sprayed surface as large as about 6 to about 10 μm in terms of arithmetic average surface roughness Ra.

When a component for a plasma etching apparatus on which a thermally sprayed film having a large number of voids and large surface roughness as described above is formed is used, the life of the component for a plasma etching apparatus is shortened because plasma etching of the base material of the component for a plasma etching apparatus proceeds via the voids, and an amount of the generation of particles increases because the thermally sprayed film becomes brittle by concentration of the plasma discharge on convex portions of the thermally sprayed film.

Further, a line width (wiring width) of recent semiconductor elements has been reduced in order to achieve greater packaging density (high integration degree). The reductions in line width have gone, for example, as far as 32 nm, 24 nm, and even 19 nm. In such narrowed wiring or elements containing the wiring, mixture of even extremely small particles having a diameter of about 0.1 μm, for example, cause serious defects of wiring or defects of elements. Therefore, in recent years, there has been strong demand to curb and suppress the generation of even extremely small particles.

In forming a thermally sprayed film, usually a blasting process is conducted as pre-treatment for formation of the film, which involves blowing abrasive grains or the like together with high-pressure fluid on the surface of the base material. However, when the blasting process is conducted in this way, residual fragments of blasting material (abrasive grains) are left on the surface of the base material or a fractured layer is formed by the blasting on the surface of the base material.

When a thermally sprayed film is formed on the surface of the base material on which blasting material is left or a fractured layer is formed, stresses act on an interface between the base material and the thermally sprayed film due to heat membrane stresses resulting from temperature changes caused by the plasma discharge, and film peeling of the entire thermally sprayed film becomes liable to occur. Particularly when pressure and abrasive grain size are increased in the blasting process, the generation of film peeling becomes remarkable. Therefore, the life of the thermally sprayed film will greatly vary depending also on conditions of the blasting process.

In this way, the method of forming a thermally sprayed film on the surface of the base material of a component for a plasma etching apparatus has a problem in that the thermally sprayed film tends to become a particle source, reducing production yields and that the life span of the thermally sprayed film greatly changes according to situations of the blasting process.

The present invention has been made in view of the above circumstances and has an object to provide a component for a plasma processing apparatus which can stably and effectively curb and suppress the generation of particles from a film and peeling of the film due to high corrosion resistance and strength of the film, and the present invention also has an object to provide a method for manufacturing the component for a plasma etching apparatus.

Means for Solving the Problems

The present inventors have found that, by providing an underlayer comprising a metal oxide film having a thermal conductivity of 35 W/m·K or less on a surface of a base material, film density of an yttrium oxide film provided on the underlayer can be improved and the yttrium oxide film that does not practically cause internal defects, internal strains, and microcracks can be formed.

The present invention has been completed based on above technical findings that, by providing the underlayer comprising a metal oxide film having a thermal conductivity of 35 W/m·K or less on the surface of the base material as described above, it becomes possible to stably and effectively suppress the generation of particles from the film and peeling of the film while suppressing production of reaction products on a surface of the film and generation of particles from the reaction products.

A component for a plasma processing apparatus according to the present invention is to solve the above problems, the component comprising: a base material; and an yttrium oxide film, wherein the component has a metal oxide film having a thermal conductivity of 35 W/m·K or less as an underlayer of the yttrium oxide film, the yttrium oxide film contains at least either particulate portions made of yttrium oxide or non-particulate portions made of yttrium oxide, the particulate portions being portions where a grain boundary demarcating an outer portion of the grain boundary is observed under a microscope, and the non-particulate portions being portions where the grain boundary is not observed under a microscope, the yttrium oxide film has a film thickness of 10 μm or more and a film density of 96% or more, and when a surface of the yttrium oxide film is observed under a microscope, an area coverage ratio of the particulate portions is 0 to 20% in an observation range of 20 μm×20 μm and an area coverage ratio of the non-particulate portions is 80 to 100% in the observation range.

A method for manufacturing a component for a plasma processing apparatus according to the present invention is to solve the above problems, the component comprising: a base material; a metal oxide film having a thermal conductivity of 35 W/m·K or less as an underlayer, and an yttrium oxide film formed by an impact sintering process and covering a surface of the underlayer, wherein the method comprises: a step of forming the underlayer by a thermal spraying method; a step of supplying raw slurry containing yttrium oxide base powder to combustion flame sprayed from a combustion chamber; and a step of spraying the yttrium oxide base powder in the combustion flame on the surface of the base material at a spraying speed of 400 to 1000 m/sec.

Advantages of the Invention

The component for a plasma etching apparatus and the method for manufacturing the component for a plasma etching apparatus according to the present invention improve plasma resistance of the component for a plasma etching apparatus and stably and effectively suppress the generation of particles.

DESCRIPTION OF EMBODIMENTS

A component for a plasma processing apparatus and a method for manufacturing the component for a plasma processing apparatus according to the present invention will be described below.

[Component for Plasma Processing Apparatus]

Figure 1:
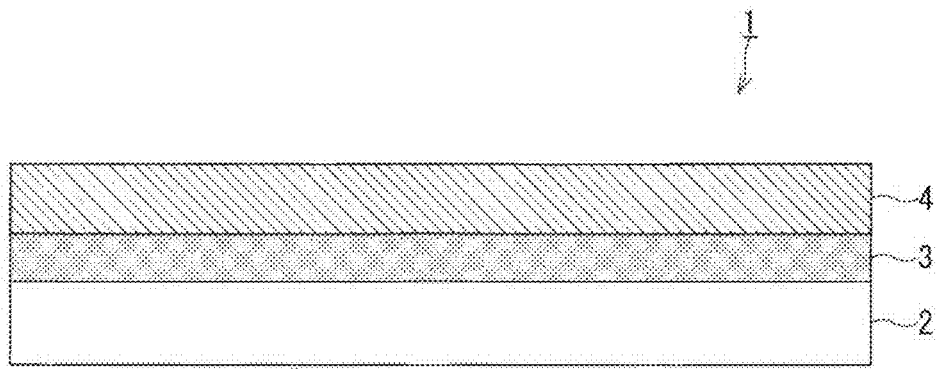
FIG. 1 is a sectional view illustrating an example of a component for a plasma processing apparatus according to the present invention.

The component for a plasma processing apparatus according to the present invention comprises a base material, an underlayer covering a surface of the base material, and an yttrium oxide film covering a surface of the underlayer. FIG. 1 is a cross sectional view illustrating an example of the component for a plasma processing apparatus according to the present invention. In the figure, a reference numeral 1 denotes a component for a plasma processing apparatus, a reference numeral 2 denotes a base material, reference numeral 3 denotes an underlayer, and a reference numeral 4 denotes an yttrium oxide film.

(Base Material)

The base material used for the component for a plasma processing apparatus according to the present invention is a member which is covered with the underlayer. In addition, the surface of the underlayer is further covered with the yttrium oxide film.

The base material can be a member, for example, used for a member exposed to plasma and radicals generated in a plasma process among members used for a component for a plasma processing apparatus. Here, examples of the plasma process to be used in the present invention include a plasma etching process and a plasma CVD process. The base material can be a member, for example, used for a wafer arrangement member, an inner wall portion, a deposition shield, an insulating ring, an upper electrode, a baffle plate, a focus ring, a shield ring, and a bellows cover which are members of a semiconductor manufacturing apparatus or liquid crystal device manufacturing apparatus.

Examples of the material for the base material include ceramics such as quartz, alumina, and yttria and metals such as aluminum.

(Underlayer)

The underlayer comprises a metal oxide film having a thermal conductivity of 35 W/m·K or less and is a layer that covers the base material. The surface of the underlayer is usually covered with the yttrium oxide film. In the present invention, by providing the yttrium oxide film on the underlayer comprising a metal oxide film having a thermal conductivity as low as 35 W/m·K or less, or even as low as 20 W/m·K or less, the surface of the yttrium oxide film can be made so as to have a region where the yttrium oxide particles bond of 80% or more. In addition, the underlayer may have a multi-layer structure in which two or more underlayers having the same or different compositions are laminated.

By providing the yttrium oxide film formed by an impact sintering process on the underlayer having such a low thermal conductivity, the underlayer suppresses heat transfer thereby making it possible to prevent the heat generated at the time of collision of the yttrium oxide particles from being transferred to the base material side more than necessary. Therefore, when the yttrium oxide film is formed on the surface of the underlayer by the impact sintering process in the case where the surface of the base material has been covered by the underlayer, destructive heat generated by the collision among yttrium oxide particles or the destructive heat generated by the collision between the yttrium oxide particle and the underlayer is used for the sintering among the yttrium oxide particles, thereby making it possible to effectively form the yttrium oxide film in which yttrium oxide particles are bonded to each other. In addition, when the yttrium oxide particles are bonded to each other, the regions where grain boundaries between grains are not identifiable, namely, non-particulate portions described below are formed.

As will be described later, the yttrium oxide film contains at least either particulate portions or non-particulate portions. When the ratio of the non-particulate portions in the yttrium oxide film is increased, the durability of the yttrium oxide film against plasma attacks is improved. Therefore, the yttrium oxide film in which the ratio of the non-particulate portions has increased, when used for a plasma processing apparatus, can prevent generation of dust from the plasma treatment apparatus. Particularly, since bonding strength among yttrium oxide particles is high in the yttrium oxide film in which the ratio of the non-particulate portions is set to 80% or more, the withstand voltage is improved. Therefore, the durability of the yttrium oxide film in which the ratio of the non-particulate portions is set to 80% or more can be improved even under a stronger plasma condition.

Further, when the underlayer is formed between the base material and the yttrium oxide film, the destructive heat in a film deposition step by the impact sintering process can be effectively utilized for the formation of the yttrium oxide film due to the heat transfer suppressing action of the underlayer, and therefore production yields of the component for a plasma processing apparatus are improved.

Further, when the underlayer comprising a metal oxide is provided on the surface of the base material, adhesiveness between the base material and the yttrium oxide film formed on the underlayer becomes high.

It is preferable that the underlayer comprise at least one compound selected from yttrium oxide, aluminum oxide, rare earth oxides, zirconium oxide, hafnium oxide, niobium oxide, and tantalum oxide. As a rare earth oxide, at least one compound selected from cerium oxide, dysprosium oxide, lanthanum oxide, neodymium oxide, and samarium oxide are preferably used.

In addition, when the underlayer comprises two or more metal oxides, the metal oxides may be a mixture of two or more metal oxides or may be a metal complex oxide containing the above-described metal oxides. As a metal complex oxide, YAG (yttrium/aluminum/garnet, $Y_3Al_5O_{12}$) or the like is used. Further, the underlayer may be configured as a multi-layered underlayer made of different metal oxide films.

Since at least one of the above-described yttrium oxide, aluminum oxide, rare earth oxides, zirconium oxide, hafnium oxide, niobium oxide, and tantalum oxide or YAG has a low thermal conductivity, it is easy to form the underlayer comprising a metal oxide film having a thermal conductivity of 35 W/m·K or less, or even 20 W/m·K or less. Further, as will be described later, since it is easy to form a metal oxide film with these materials by a thermal spraying method, manufacturing is easy.

The underlayer usually has a film density of 85% or more, preferably 85 to 98%, and more preferably 85 to 95%. The underlayer having a film density of 85 to 98% here means that the underlayer has a void ratio (porosity) of 15 to 2%.

When voids (pores) exist in the underlayer in this way, the thermal conductivity of the underlayer (metal oxide film) can be made small.

On the other hand, when the film density of the underlayer is less than 85%, the number of voids in the underlayer is too large and the film strength is reduced. In this way, when the film strength is reduced, there is a possibility that cracks occur in the underlayer to cause film peeling at the time when the yttrium oxide film is formed on the underlayer. Further, when the film strength is reduced, there is a possibility that the surface roughness of the yttrium oxide film to be provided on the underlayer becomes large. Furthermore, when the film density of the underlayer exceeds 98%, it becomes difficult to obtain the effect of reducing the thermal conductivity due to the formation of voids.

It is preferable that the underlayer has a film thickness of 40 to 300 μm. When the thickness of the underlayer is less than 40 μm, the destructive heat becomes liable to be transferred through the underlayer to the base material and therefore the effect brought by providing the underlayer becomes small. On the other hand, when the thickness of the underlayer exceeds 300 μm, the effect of preventing destructive heat transfer to the base material becomes high, but the strength of the underlayer is reduced, which causes film peeling and the like. Particularly when the film thickness exceeds 300 μm in the case of setting the film density to 95% or less, the film peeling is liable to occur.

As described above, it is effective to control the material, film density, and film thickness in order to control the thermal conductivity of the underlayer. The control of material, film density, film thickness, or the like may be conducted in combination of two or more. What is important is that the thermal conductivity of the underlayer is set to 35 W/m·K or less, further 20 W/m·K or less, and more preferably 15 W/m·K or less.

As a measurement method for the thermal conductivity of the underlayer, a laser flash method is used. The measurement of the thermal conductivity by means of the laser flash method uses a method in which a thermally sprayed film for the underlayer is formed on a sample made of a disk-shaped base material, the sample having a diameter of 10 mm and a thickness of 2 mm, thereafter the sample is irradiated with a laser beam, and a temperature history curve at the back side of the sample is analyzed to determine the thermal conductivity. In addition, it is preferable that the disk-shaped base material be a base material made of Al material.

The surface roughness (arithmetic average surface roughness Ra) of the underlayer is preferably 7 μm or less, and more preferably 5 μm or less.

The film density of the underlayer is preferably 85 to 98%, and since the number of voids is large, surface asperities (irregularities) are liable to be formed. When the surface of the underlayer having large surface asperities is covered by the yttrium oxide film, there is a possibility that the obtained yttrium oxide film has large surface asperities and dust is generated from the yttrium oxide film. Further, the film density of the underlayer is preferably 85 to 98%, and since the number of voids is large, the yttrium oxide film becomes liable to peel when a gap that is much larger than the voids is produced between the underlayer and the yttrium oxide film. The surface roughness Ra of the underlayer is set to preferably 7 μm or less, and more preferably 5 μm or less to thereby make it possible to curb and suppress the generation of dust from the yttrium oxide film or occurrence of peeling of the yttrium oxide film.

(Yttrium Oxide Film)

The yttrium oxide film contains at least either particulate portions made of yttrium oxide or non-particulate portions made of yttrium oxide, where the particulate portions are portions in which a grain boundary demarcating an outer portion of the grain boundary is observed under a microscope observation, and the non-particulate portions are portions in which the grain boundary is not observed under the microscope observation. The yttrium oxide film has a film thickness of 10 μm or more and a film density of 96% or more, and when a surface of the yttrium oxide film is observed under a microscope, an area coverage ratio of the particulate portions is 0 to 20% in an observation range of 20 μm×20 μm and an area coverage ratio of the non-particulate portions is 80 to 100% in the observation range.

Further, it is preferable that such an yttrium oxide film be formed using the impact sintering process.

The impact sintering process here is a method for forming a film on the surface of the underlayer formed on the base material by supplying raw material-containing matter containing base powder which is to be sintered, such as yttrium oxide base powder, into combustion flame of combustion gas, and sintering and bonding the base powder on the surface of the underlayer on the base material by the destructive heat deriving from collision to deposit particles on the surface of the base material.

Further, since the destructive heat is used in the impact sintering process, the base powder can be sprayed at high speed together with the combustion gas of the combustion flame toward the base material on which the underlayer that is an object to be covered is formed unlike a conventional thermal spraying method in which the base powder is molten. Therefore, according to the impact sintering process, unmolten (non-molten) yttrium oxide base powder is sprayed at the underlayer on the base material and is fixed on the surface of the underlayer on the base material to thereby form a film.

In addition, the base powder in the present invention means particles sprayed in order to create a film. For example, the yttrium oxide base powder means yttrium oxide particles sprayed in order to create an yttrium oxide film. On the other hand, the yttrium oxide particles constituting the yttrium oxide film is simply referred to as yttrium oxide particles.

When observation is conducted under a microscope, usually, three-dimensionally shaped portions with great depth from the surface and planar portions with small depth are observed on the surface of an yttrium oxide film formed by the impact sintering process. The reason is as follows.

In the impact sintering process, when sprayed non-molten base powder collides with the surface of the underlayer on the base material or the surface of an already formed yttrium oxide film at high speed, particles of the base powder as they are or fragments of the base powder crushed at the time of collision are sintered and bonded by destructive heat at the time of collision. The destructive heat at the time of collision here means heat produced when the base powder is deformed or crushed at the time of collision.

In this way, since the yttrium oxide film formed by the impact sintering process is formed through sintering and bonding by the destructive heat resulting from the collision, the three-dimensionally shaped portions and the planar portions occur in the yttrium oxide film. Here, the three-dimensionally shaped portions are portions where particles of the base powder remain as they are or the shapes of the fragments of the base powder mostly maintain due to a small amount of destructive heat at the time of collision resulting from a small number of base powder collisions, and the planar portions are portions which are produced by bonding or greatly deforming base powder or its fragments due to a large amount of destructive heat resulting from a large number of base powder collisions.

The three-dimensionally shaped portion here, in which a grain boundary demarcating an outer portion of the grain boundary is often observed under a microscope, is referred to as a particulate portion in the present invention. On the other hand, the planar portion, in which the grain boundary demarcating the outer portion of the grain boundary often is not observed under a microscope, is referred to as a non-particulate portion in the present invention.

That is, on an yttrium oxide film, a portion in which a grain boundary of an yttrium oxide particle is observed is referred to as a particulate portion, and a portion in which a grain boundary of an yttrium oxide particle is not identifiable is referred to as a non-particulate portion.

The grain boundaries of the particulate portions can be identified, for example, by observing at a magnification of 5000 using an electron microscope.

The particulate portions, which undergo only a small degree of deformation from the base powder or its fragments, usually have particle-shaped contours. On the other hand, the non-particulate portions, which undergo a large degree of deformation from the base powder or its fragments, usually do not have particle-shaped contours.

Since the impact sintering process forms a film by spraying mostly non-molten base powder at high speed, the manner of collision of the base powder varies depending on spraying conditions. Further, when mostly non-molten base powder is sprayed, since raw material-containing matter containing base powder is usually supplied into combustion flame of combustion gas and sprayed, the manner of collision of the base powder varies depending on whether the base powder exists in the combustion flame or on a surface of the combustion flame. Therefore, the yttrium oxide film formed by the impact sintering process generally tends to contain a mixture of particulate portions and non-particulate portions.

In contrast, in the present invention, the destructive heat can be used for bonding yttrium oxide particles by forming the yttrium oxide film on the prescribed underlayer using the impact sintering process as described previously. Therefore, the area of non-particulate portions of the yttrium oxide film can be made as high as 80% or more, or further 90% or more and 100% or less. Further, according to the yttrium oxide film of the present invention, the film density can be made to be 96% or more.

Further, since the yttrium oxide film formed by the impact sintering process contains a mixture of the particulate portions and the non-particulate portions and gaps among the particulate portions are filled with the non-particulate portions, the film tends to have a high film density. The film density here means a ratio of an actual volume of substances constituting the film to an apparent volume of the film.

Incidentally, since molten base powder is sprayed in the conventional thermal spraying method, almost none of substances constituting the thermally sprayed film obtained after solidification maintains a crystal structure or powder shape of the base powder. Therefore, stresses occur in the yttrium oxide film formed by the thermal spraying method. Further, since the film formed by the thermal spraying method is deposited as flat-shaped particles on the surface of the base material and the surface of the underlayer on the base material, microcracks occur on surfaces of the flat-shaped particles.

In contrast, since the yttrium oxide film formed by the impact sintering process is formed by spraying the base powder at high speed while keeping the base powder mostly non-molten, the crystal structure and powder shape of the base powder are maintained when the base powder is sprayed. Therefore, although some of the substances constituting the obtained yttrium oxide film change their crystal structure into the crystal structure different from that of the base powder under the influence of destructive heat resulting from the impact, the rest of the substances retains the crystal structure of the base powder.

Further, with respect to microscopic shapes of the substances constituting the obtained yttrium oxide film, although part of the yttrium oxide film becomes the non-particulate portions greatly different from the shape of the base powder under the influence of destructive heat resulting from the impact, the rest of the yttrium oxide film becomes the particulate portions with shapes similar to the shape of the base powder or shape of crushed base powder. Therefore, with respect to the yttrium oxide film formed by the impact sintering process, the stresses occurring inside of the film become appropriate, resulting in high film strength.

The yttrium oxide film formed by the impact sintering process is preferable because the crystal structure of the substances constituting the obtained yttrium oxide film can be controlled by adjusting manufacturing conditions in the impact sintering process.

For example, when the crystal structure of the base powder is made up of only cubic crystals and the crystal structure of the yttrium oxide film formed by the impact sintering process is made up of cubic crystals and monoclinic crystals, abundance ratios of cubic crystals and monoclinic crystals in the yttrium oxide film can be adjusted by adjusting the manufacturing conditions in the impact sintering process.

Furthermore, since the yttrium oxide film formed by the impact sintering process is formed by spraying the base powder at high speed while keeping the base powder mostly non-molten, the particulate portions of the yttrium oxide film maintain the shape of the base powder as it is or shape of crushed base powder, and therefore have a shape close to a spherical shape. Thus, in the particulate portions of the yttrium oxide film formed by the impact sintering process, microcracks are less liable to occur on the surfaces of the particles which are close to a spherical shape.

Furthermore, since the base powder or its fragments are bonded or greatly deformed due to a large amount of destructive heat resulting from collisions in the non-particulate portions of the film formed by the impact sintering process, deposited substances are bonded strongly. Therefore, the film formed by the impact sintering process tends to be a dense, strongly bonded film due to the existence of the non-particulate portions.

The yttrium oxide film according to the present invention is formed by the impact sintering process using yttrium oxide base powder as base powder.

Yttrium oxide has high corrosion resistance against plasma attacks by plasmas such as chlorine-based plasma and fluorine-based plasma as well as against radical attacks by radicals such as active F radicals and Cl radicals, and therefore the yttrium oxide is preferable as a film for a component for a plasma etching apparatus.

Purity of yttrium oxide in the yttrium oxide film is usually 99.9% or more, and preferably 99.99% or more.

When the purity of yttrium oxide in the yttrium oxide film is 99.9% or more, the possibility of impurities being mixed in products to be plasma-etched is small in conducting plasma etching using the component for a plasma etching apparatus.

Particularly, when the purity of yttrium oxide in the yttrium oxide film is 99.99% or more, even in steps such as semiconductor manufacturing steps in which mixing of impurities in products is strictly limited, there is practically no possibility of impurities being mixed in semiconductors.

On the other hand, when the purity of yttrium oxide in the yttrium oxide film is less than 99.9%, there is a possibility that impurities in the yttrium oxide constituting the yttrium oxide film get mixed in products to be plasma-etched in conducting plasma etching.

The yttrium oxide film according to the present invention contains at least either of particulate portions made of yttrium oxide or non-particulate portions made of yttrium oxide, where the particulate portions are portions in which a grain boundary demarcating an outer portion of the grain boundary is observed under a microscope, and the non-particulate portions are portions in which the grain boundary is not observed under a microscope.

With respect to the grain boundary of the particulate portion, for example, when the surface of the yttrium oxide film is observed at a magnification of 5000 using an electron microscope, if a line highly contrasted with a central portion of the particulate portion is observed between the particulate portion and a portion around the particulate portion, namely, a portion adjacent to the particulate portion, the line can be recognized as a grain boundary. Usually, contrast is such that the line around the particulate portion appears in a darker tone than that of the central portion of the particulate portion.

On the other hand, a grain boundary that is a line highly contrasted with a particle-shaped portion is not observed around the particle-shaped portion in the non-particulate portion.

<Ratios of Particulate Portions and Non-Particulate Portions>

With respect to the yttrium oxide film according to the present invention, when the surface of the yttrium oxide film is observed under a microscope, usually an area coverage ratio of the particulate portions is 0 to 20% in an observation range of 20 μm×20 μm and an area coverage ratio of the non-particulate portions is 80 to 100% in the observation range.

Preferably an area coverage ratio of the particulate portions is 0 to 10% and an area coverage ratio of the non-particulate portions is 90 to 100%. More preferably an area coverage ratio of the particulate portions is 0 to 5% and an area coverage ratio of the non-particulate portions is 95 to 100%. A sum total of the area coverage ratio of the particulate portions and area coverage ratio of the non-particulate portions here is 100%.

To calculate out the area coverage ratio of the particulate portions and area coverage ratio of the non-particulate portions, for example, an observation range of 20 μm×20 μm is set at three or more locations and an average value of the area coverage ratios of the particulate portions in respective observation ranges and an average value of the area coverage ratios of the non-particulate portions in respective observation ranges are calculated out.

When the area coverage ratio of the particulate portions of the yttrium oxide film exceeds 20%, the yttrium oxide film partially has reduced density or reduced bonding strength, resulting in a possibility of reduced durability of the yttrium oxide film and crack occurrence. The reason is as follows.

That is, when the area coverage ratio of the particulate portions is so high as to exceed 20%, this means that there is a large area in which the destructive heat resulting from the impact on yttrium oxide base powder serving as base powder is not sufficient. The area in which the destructive heat resulting from the impact is not sufficient means a portion where the sprayed yttrium oxide base powder is cooled rapidly on the surface of the underlayer on the base material or on the surface of the yttrium oxide film. Therefore, in the area where the destructive heat resulting from the impact is not sufficient, the formed yttrium oxide film is subject to reduced yttrium oxide density or reduced bonding strength, thereby cracks become liable to occur.

In addition, when the film density of the yttrium oxide film is less than 96%, there exist a large number of voids (pores) in the yttrium oxide film. Therefore, when a large number of voids exist in the yttrium oxide film, the withstand voltage of the yttrium oxide film is reduced. According to the component for a plasma processing apparatus of the present invention, the film density of the yttrium oxide film can be made 96% or more, and even 99 to 100%, and the withstand voltage can greatly be improved.

<Average Particle Diameter of Particulate Portions>

An average particle diameter of the particulate portions of the yttrium oxide film is usually 2 μm or less, and preferably 0.5 to 2 μm.

The average particle diameter of the particulate portions here is an average value of particle diameters of the particulate portions. Further, the particle diameter of a particulate portion is the length of the largest line segment among line segments linking two points arbitrarily set on the grain boundary of the particulate portion shown in a photograph taken by observing the surface of the yttrium oxide film under a microscope. The particle diameters of 20 particulate portions are measured and an arithmetic mean value of the particle diameters of the 20 particulate portions is determined as the average particle diameter of the particulate portions.

It is preferable that the average particle diameter of the particulate portions be 2 μm or less from the standpoint of increasing the film density because this may reduce the gaps (triple points) among the yttrium oxide particles constituting the particulate portions.

On the other hand, when the average particle diameter of the particulate portions exceeds 2 μm, the gaps among the yttrium oxide particles become large and there is a possibility that the film density is reduced.

<Overall Average Particle Diameter of Particulate Portions and Non-Particulate Portions>

An overall average particle diameter of particulate portions and non-particulate portions of the yttrium oxide film is usually 5 μm or less, and preferably 1 to 5 μm.

Here, the overall average particle diameter of particulate portions and non-particulate portions is an arithmetic mean value of the average particle diameter of the particulate portions and average particle diameter of the non-particulate portions.

The average particle diameter of the non-particulate portions is a diameter of an imaginary circle set on a non-particulate portion shown in a photograph taken by observing the surface of the yttrium oxide film under a microscope. The imaginary circle here is a circle created by assuming that, in a portion constituting the non-particulate portion of an indeterminate form and having a contour equal to or larger than a semicircle, the contour of the portion having a contour equal to or larger than a semicircle is a part of a circumference. Fifty imaginary circles are established and an arithmetic mean value of the diameters of the 50 imaginary circles is determined as the average particle diameter of the non-particulate portions.

As described above, the average particle diameter of the particulate portions is calculated out based on 20 line segments of the particulate portions and the average particle diameter of the non-particulate portions is calculated out based on 50 imaginary circles of the non-particulate portions. Therefore, the overall average particle diameter of the particulate portions and non-particulate portions, which is an arithmetic mean value of the average particle diameter of the particulate portions and the average particle diameter of the non-particulate portions, is an arithmetic mean value calculated out based on the lengths of 20 line segments of the particulate portions and the diameters of the 50 imaginary circles of the non-particulate portions.

It is preferable that the overall average particle diameter of the particulate portions and non-particulate portions be 5 μm or less because the gaps (triple points) among the yttrium oxide particles constituting the particulate portions and non-particulate portions are reduced to improve the film density, and a bonding area between adjacent yttrium oxide particles becomes large to improve the film strength.

When the overall average particle diameter of the particulate portions and non-particulate portions exceeds 5 μm, there is a possibility that the film density or film strength is reduced because of increased gaps among yttrium oxide particles.

<Crystal Structure of Yttrium Oxide Film>

The yttrium oxide film contains crystal structures of both cubic crystals and monoclinic crystals.

When a peak value of the strongest peak of a cubic crystal is denoted by Ic and a peak value of the strongest peak of a monoclinic crystal is denoted by Im, each obtained by XRD analysis (X-ray diffraction analysis), a peak value ratio Im/Ic of the yttrium oxide film is usually 0.2 to 0.6.

The XRD analysis is conducted by a 2θ method under the conditions of using a Cu target at an X-ray tube voltage of 40 kV and an X-ray tube current of 40 mA.

The strongest peak of the cubic crystals is detected at region of 28 to 39 degree, and the strongest peak of the monoclinic crystals is detected at region of 30 to 33 degree.

Yttrium oxide base powder which is the base powder of the yttrium oxide film is usually made up of only cubic crystals at room temperature.

In contrast, in the yttrium oxide film according to the present invention, part of cubic crystals changes in crystal structure and turns into monoclinic crystals due to the destructive heat resulting from the impact during formation of the yttrium oxide film. The peak value ratio Im/Ic of the yttrium oxide film according to the present invention usually becomes 0.2 to 0.6 as described above.

When the peak value ratio Im/Ic of the yttrium oxide film is 0.2 to 0.6, the cubic crystals and the monoclinic crystals coexist in appropriate quantities, and therefore the film strength of the yttrium oxide film increases. Yttrium oxide base powder is usually made of cubic crystals. The coexistence of cubic crystals and monoclinic crystals shows that the crystal structure has changed by the impact sintering process, and therefore shows that bonding due to the destructive heat is progressing. The film strength is improved because of this bonding.

On the other hand, when the peak value ratio Im/Ic of the yttrium oxide film exceeds 0.6, the amount of monoclinic crystals are too large, and therefore, internal stresses resulting from transformation into monoclinic crystals strongly act on the yttrium oxide constituting the yttrium oxide film.

Therefore, when the peak value ratio Im/Ic of the yttrium oxide film exceeds 0.6, film characteristics such as film strength of the yttrium oxide film deteriorate.

<Film Thickness>

The film thickness of the yttrium oxide film according to the present invention is usually set to 10 μm or more, preferably 10 to 200 μm, and more preferably 50 to 150 μm.

When the film thickness of the yttrium oxide film is 10 μm or more, the effects of curbing and suppressing the generation of particles, and the like resulting from providing the yttrium oxide film on the surface of the underlayer on the base material can be sufficiently obtained.

When the film thickness of the yttrium oxide film is too large, the effects of suppressing the generation of particles, and the like resulting from providing the yttrium oxide film on the surface of the underlayer on the base material is not further improved. On the contrary, being the film thickness too large is not economical because of increased production cost of the yttrium oxide film. Therefore, it is preferable that an upper limit of the film thickness of the yttrium oxide film be set to 200 μm.

On the other hand, when the film thickness of the yttrium oxide film is less than 10 μm the effects of suppressing the generation of particles, and the like resulting from providing the yttrium oxide film on the surface of the underlayer on the base material cannot sufficiently be obtained, and besides, there is a possibility that the yttrium oxide film peels off.

<Film Density>

The film density of the yttrium oxide film according to the present invention is 96% or more, and preferably 99 to 100%. In relation to the yttrium oxide film according to the present invention, the film density is an index which represents a ratio of an actual volume of the substances constituting the film to an apparent volume of the film. The film density is a concept contrasted with a void ratio, and a sum total of the film density and void ratio is 100%. For example, a film density of 96% or more means that the void ratio is 4% or less.

The film density is calculated out, for example, by taking an enlarged photograph of a cross section along a thickness direction of the yttrium oxide film at a magnification of 500 using an optical microscope, thereafter calculating out an area coverage ratio of an empty portion (void portion) in a measurement region set in the enlarged photograph, designating the area coverage ratio as the void ratio (%), subtracting the void ratio (%) from 100%, and designating a resulting difference as the film density (%).

The measurement region in the enlarged photograph here is usually provided as a square region of 200 μm long×200 μm wide=40000 μm$^2$. In addition, if a square measurement region of 200 μm×200 μm cannot be found for the reason of small film thickness of the yttrium oxide film or the like, a plurality of measurement regions are set as a measurement region in the enlarged photograph so that the total area of the measurement regions having a shape other than the 200 μm×200 μm square becomes 40000 μm$^2$, then a void ratio (%) per total area of 40000 μm$^2$ is calculated out, and the film density (%) is calculated out based thereon.

When the film density of the yttrium oxide film is 96% or more, erosion such as plasma attacks via voids (pores) in the yttrium oxide film does not progress significantly, and therefore the withstand voltage of the yttrium oxide film is improved and the life of the yttrium oxide film can be extended.

On the other hand, when the film density of the yttrium oxide film is less than 96%, there exist a large number of voids in the yttrium oxide film and erosion such as plasma attacks progresses via the voids, and therefore the life span of the yttrium oxide film tends to be shortened.

In the component for a plasma processing apparatus, in order to prevent erosion such as plasma attacks from progressing via voids in the yttrium oxide film, it is preferable, in particular, that the number of voids existing in the surface of the yttrium oxide film is small. Therefore, according to the present invention, it is preferable that the measurement region set on the enlarged photograph of a cross section along the thickness direction of the yttrium oxide film in order to measure the film density be close to the surface of the yttrium oxide film.

Further, the similar measurement method is applied with respect to the measurement of the film density of the underlayer. Specifically, an enlarged photograph of a cross section in the thickness direction of the underlayer is taken, and the ratio of the metal oxide constituting the underlayer to the voids is measured. The enlarged photograph by which the film density of the underlayer is measured may have an area of 200 μm wide×40 μm thick=8000 μm$^2$ or more. If 8000 μm$^2$ or more of an area cannot be photographed in one field of vision, the area may be photographed dividedly a plurality of times.

<Surface Roughness>

The surface roughness Ra (arithmetic average surface roughness) of the yttrium oxide film is usually set to 3 μm or less, and preferably 2 μm or less.

The surface roughness Ra is measured in accordance with a method described in JIS-B-0601-1994.

When the surface roughness Ra of the yttrium oxide film is 3 μm or less, attacks such as plasma attacks do not concentrate on asperities formed by the particulate portions and non-particulate portions on the surface of the yttrium oxide film, and therefore the life span of the yttrium oxide film is extended.

On the other hand, when the surface roughness Ra of the yttrium oxide film exceeds 3 μm, there is a possibility that the attacks such as plasma attacks concentrate on asperities formed by the particulate portions and non-particulate portions on the surface of the yttrium oxide film, and therefore the life span of the yttrium oxide film is shortened.

Being formed by the impact sintering process, the yttrium oxide film according to the present invention is dense and strongly bonded. Further, since the yttrium oxide film according to the present invention is formed by the impact sintering process, stresses are less liable to occur in the film and microcracks are less liable to occur on the surface of the film.

In addition, since the underlayer comprising a metal oxide film having high insulation properties between the base material and the yttrium oxide film is provided in the component for a plasma processing apparatus according to the present invention, the withstand voltage is improved.

The component for a plasma processing apparatus according to the present invention will be described with reference to drawings.

FIG. 1 is a sectional view illustrating an example of the component for a plasma processing apparatus according to the present invention. As shown in FIG. 1, in a component for a plasma processing apparatus 1, an underlayer 3 and an yttrium oxide film 4 are formed on a surface of a base material 2.

Figure 2:
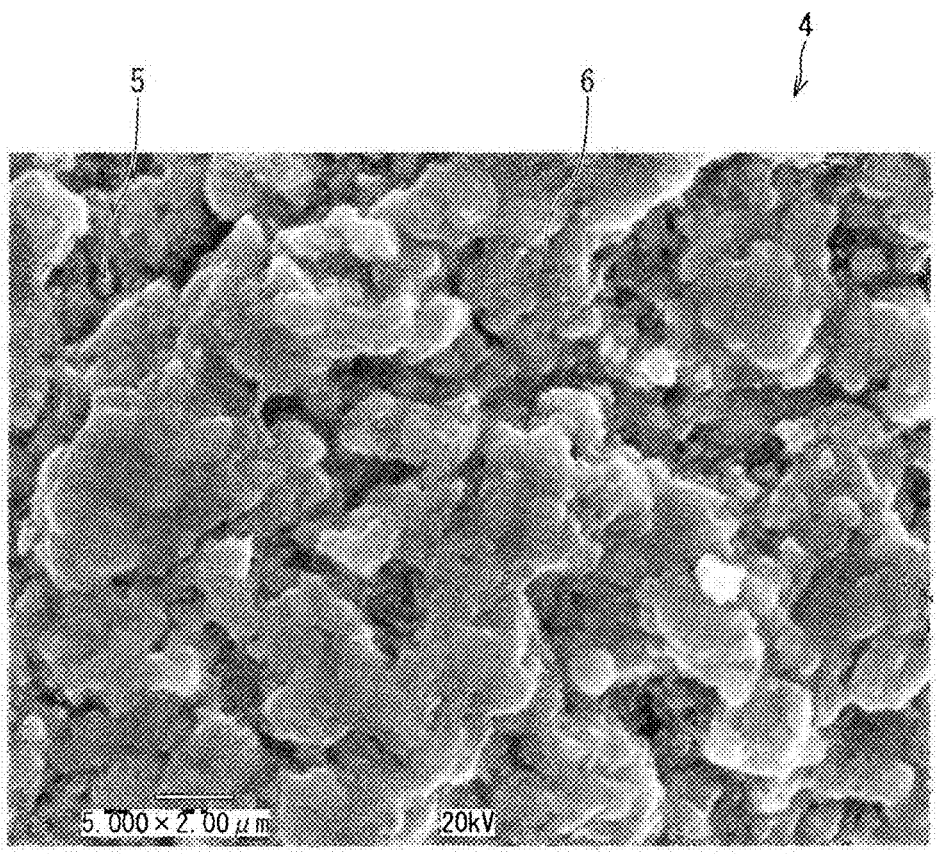
FIG. 2 is an enlarged photograph showing a surface of an example of an yttrium oxide film of the component for a plasma processing apparatus in Example 1.

FIG. 2 is a photograph showing a surface of an example of an yttrium oxide film of the component for a plasma processing apparatus in Example 1. As shown in FIG. 2, the yttrium oxide film 4 is formed from particulate portions 5 and non-particulate portions 6.

Figure 3:
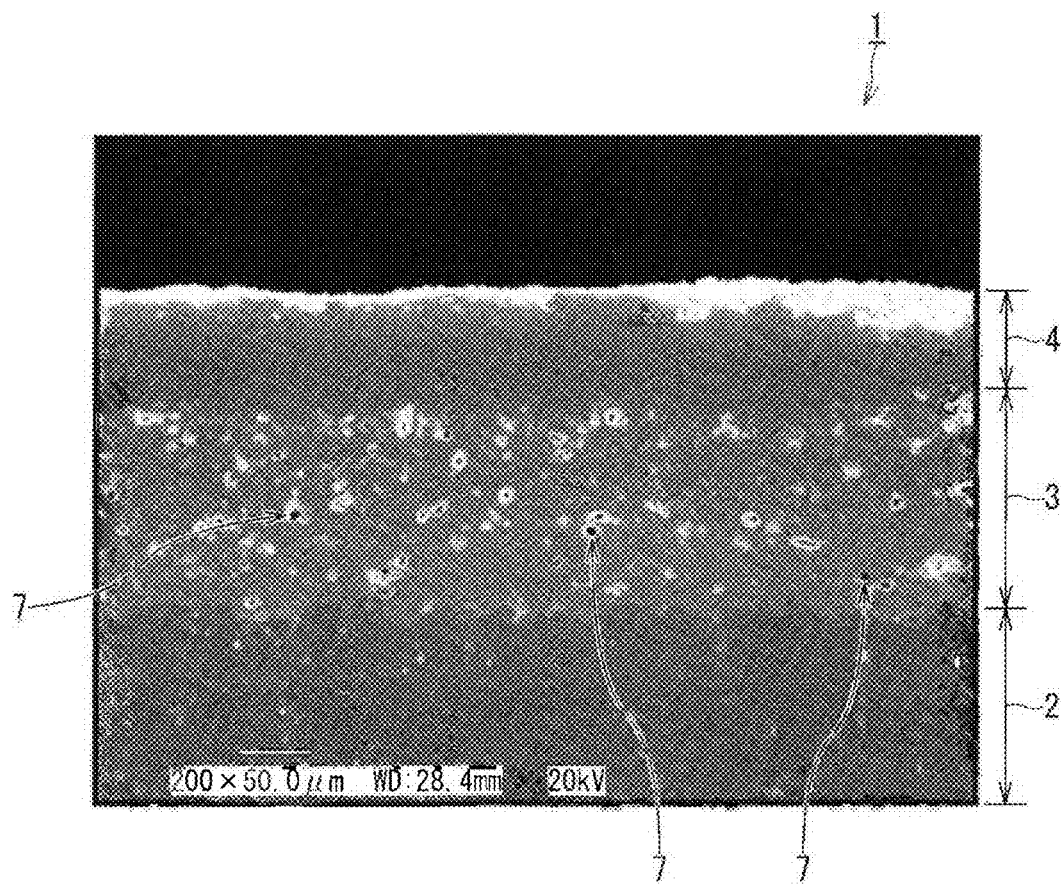
FIG. 3 is an enlarged photograph showing a cross section of an example of an yttrium oxide film/underlayer of the component for a plasma processing apparatus in Example 1.

FIG. 3 is a photograph showing a cross section of an example of the component for a plasma processing apparatus in Example 1. As shown in FIG. 3, the underlayer 3 and the yttrium oxide film 4 are formed on the base material 2 in this order, and voids 7 are formed in the underlayer 3.

[Method for Manufacturing Component for Plasma Processing Apparatus]

A method for manufacturing a component for a plasma processing apparatus according to the present invention is a method for manufacturing a component for a plasma processing apparatus, the component comprising: a base material; an underlayer covering a surface of the base material, the underlayer comprising a metal oxide film having a thermal conductivity of 35 W/m·K or less; and an yttrium oxide film formed using an impact sintering process, the yttrium oxide film covering a surface of the underlayer.

(Base Material)

The base material used for the method for manufacturing a component for a plasma processing apparatus according to the present invention is the same as the base material used for the component for a plasma processing apparatus according to the present invention, and therefore description thereof will be omitted.

(Underlayer)

The underlayer used for the method for manufacturing a component for a plasma processing apparatus according to the present invention comprises a metal oxide film having a thermal conductivity of 35 W/m·K or less. The material of the underlayer used for the method for manufacturing a component for a plasma processing apparatus according to the present invention is the same as the material of the underlayer used for the component for a plasma processing apparatus according to the present invention, and therefore description thereof will be omitted.

The method for manufacturing the underlayer is not particularly limited as far as the metal oxide film in the obtained underlayer has a thermal conductivity of 35 W/m·K or less. However, when the thermal spray method is used, it is easy to control the ingredient, film density, film thickness, or the like of the underlayer, and therefore the thermal spraying method is usually used as a method for manufacturing the underlayer. The thermal spraying method here is a film deposition method by causing base powder to melt and spraying the molten base powder.

With the thermal spraying method, the surface of the base material is covered by the underlayer comprising a metal oxide film by putting base powder for the underlayer made of a metal oxide into high temperature combustion flame to spray the base powder, and solidifying the molten metal oxide powder on the base material. In this way, since film deposition is conducted causing base powder to melt in the thermal spraying method, flat-shaped particles deposit on the surface of the base material, and therefore microcracks occur on the surface of the flat-shaped particles. And when the phenomenon of the occurrence of microcracks is utilized, the underlayer having a film density of 85 to 98% can be formed. It is preferable that the film density of the underlayer be 85 to 98% because the thermal conductivity of the underlayer becomes small by the voids (pores) moderately and appropriately existing in the underlayer.

Further, it is preferable that the material of the underlayer comprise, as described for the underlayer of the component for a plasma processing apparatus according to the present invention, at least one selected from yttrium oxide, aluminum oxide, rare earth oxides, zirconium oxide, hafnium oxide, niobium oxide, and tantalum oxide. As a rare earth oxide, at least one selected from cerium oxide, dysprosium oxide, lanthanum oxide, neodymium oxide, and samarium oxide are used. Among these, the underlayer comprising at least one selected from yttrium oxide, aluminum oxide, and rare earth oxides is preferable because the underlayer is easily created by the thermal spraying method.

The surface roughness Ra (arithmetic average surface roughness) of the underlayer is preferably 7 μm or less, and more preferably 5 μm or less.

The film density of the underlayer is preferably 85 to 98%, and since the number of voids is large, surface asperities are liable to be formed. When the surface of the underlayer having large surface asperities is covered by the yttrium oxide film, there is a possibility that the obtained yttrium oxide film has large surface asperities and dust is generated from the yttrium oxide film.

Further, the film density of the underlayer is preferably 85 to 98%, and since the number of voids is large, the yttrium oxide film becomes liable to peel when a gap that is much larger than the voids is produced between the underlayer and the yttrium oxide film.

The surface roughness Ra of the underlayer is set to preferably 7 μm or less, and more preferably 5 μm or less to thereby make it possible to curb and suppress the generation of dust from the yttrium oxide film or occurrence of peeling of the yttrium oxide film. For example, polishing is used as a method for adjusting the surface roughness of the underlayer.

(Yttrium Oxide Film)

It is preferable that the yttrium oxide film used for the method for manufacturing a component for a plasma processing apparatus according to the present invention be an yttrium oxide film formed using the impact sintering process, the yttrium oxide film covering the surface of the base material, which is similar to the yttrium oxide film used for the component for a plasma processing apparatus according to the present invention.

As described above, the yttrium oxide film used for the method for manufacturing a component for a plasma processing apparatus according to the present invention is the same as the yttrium oxide film used for the component for a plasma processing apparatus according to the present invention, and therefore description thereof will be omitted.

(Film Deposition Apparatus)

A film deposition apparatus which covers the surface of the underlayer covering the surface of the base material by an yttrium oxide film using the impact sintering process will be described.

The film deposition apparatus comprises, for example: a combustion unit comprising a combustion chamber for burning a combustion source such as a combustion gas and spraying flame in the combustion chamber to the outside as high-speed combustion flame via a combustion flame port; a slurry supply port supplying raw slurry containing yttrium oxide base powder to the combustion flame sprayed from the combustion flame port of the combustion unit; and a nozzle controlling spraying conditions of the combustion flame containing the yttrium oxide base powder.

Specifically, the combustion unit comprises, for example: the combustion chamber; a combustion source supply port supplying a combustion source to the combustion chamber; and the combustion flame port being formed to be smaller in cross section than the combustion chamber and spraying flame in the combustion chamber to the outside as high-speed combustion flame.

The slurry supply port is usually provided so as to supply the raw slurry to a flank of the sprayed combustion flame.

As a combustion source, for example, oxygen, acetylene, kerosene, and the like are used. Two or more combustion sources may be used in combination as required.

Using the film deposition apparatus as described above, mostly non-molten yttrium oxide base powder in the combustion flame is sprayed together with the combustion flame toward the surface of the underlayer covering the surface of the base material through a nozzle at high speed, thereby an yttrium oxide film is formed on the surface of the underlayer covering the surface of the base material by the impact sintering process.

In addition, the film deposition apparatus may further comprise, as required, a compressed air supply port supplying compressed air to the combustion flame. The compressed air supply port is provided so as to supply compressed air, for example, to the combustion flame sprayed through the combustion flame port or to the combustion flame supplied with raw slurry from the slurry supply port. The compressed air supply port is provided so as to allow compressed air to be supplied to the combustion flame, and thereby it becomes easy to spray the combustion flame containing the yttrium oxide base powder at high speed.

The method for manufacturing a component for a plasma etching apparatus according to the present invention comprises a step of supplying raw slurry containing yttrium oxide base powder to combustion flame sprayed from a combustion chamber (yttrium oxide base powder supply step), and a step of spraying the yttrium oxide base powder in the combustion flame on the surface of the underlayer covering the surface of the base material at a spraying speed of 400 to 1000 m/sec (yttrium oxide base powder spraying step).

(Yttrium Oxide Base Powder Supply Step)

The yttrium oxide base powder supply step is a step of supplying raw slurry containing yttrium oxide base powder to combustion flame sprayed from a combustion chamber.

<Raw Slurry>

The raw slurry containing yttrium oxide base powder used in the present invention is produced by dispersing yttrium oxide base powder serving as base powder in a solvent.

The purity of yttrium oxide in the yttrium oxide base powder serving as base powder is usually 99.9% or more, and preferably 99.99% or more.

The reason why the purity of yttrium oxide in the yttrium oxide base powder is usually 99.9% or more is the same as the reason why the purity of yttrium oxide film in the component for a plasma processing apparatus according to the present invention is usually 99.9% or more, and therefore description thereof will be omitted.

The average particle diameter of the yttrium oxide base powder is usually 1 to 5 μm and preferably 1 to 3 μm. The average particle diameter here means a cumulative volume average particle diameter $D_{50}$ measured using a laser particle size distribution measuring device.

When the average particle diameter of the yttrium oxide base powder is 5 μm or less, crushing of fine particles of the yttrium oxide base powder moderately proceeds at the time of collision of fine particles of the yttrium oxide base powder with the surface of the underlayer covering the surface of the base material or with the surface of the yttrium oxide film, and therefore heat due to the crushing facilitates bonding of yttrium oxide particles and makes it easy to form a film.

Because of high bonding strength among yttrium oxide particles, the yttrium oxide film formed in this way reduces wear caused by plasma attacks and radical attacks, decreases generation of particles, and improves plasma resistance.

Further, since the destructive heat can be utilized for bonding of yttrium oxide particles by providing the underlayer, the yttrium oxide film having a lot of non-particulate portions can be obtained.

On the other hand, when the average particle diameter of the yttrium oxide base powder exceeds 5 μm, it becomes difficult to form an yttrium oxide film because the yttrium oxide base powder scatters instead of being crushed at the time of collision of the yttrium oxide base powder with the surface of the underlayer covering the surface of the base material or with the surface of the yttrium oxide film and further there is a possibility that the yttrium oxide film is damaged by a blast effect of the yttrium oxide base powder itself to cause crack in the yttrium oxide film.

When the average particle diameter of the yttrium oxide base powder is less than 1 μm, it becomes difficult to crush the yttrium oxide base powder at the time of collision of the yttrium oxide base powder with the surface of the underlayer covering the surface of the base material or with the surface of the yttrium oxide film, and therefore there is a possibility that the formed yttrium oxide film has a low film density, and reduced plasma resistance and corrosion resistance.

In addition, as long as the average particle diameter of the yttrium oxide base powder is usually 1 to 5 μm, the yttrium oxide base powder may contain yttrium oxide particles having a particle diameter of less than 1 μm. For example, as long as the average particle diameter of the yttrium oxide base powder is usually 1 to 5 μm, the yttrium oxide base powder may contain yttrium oxide particles having a particle diameter of less than 1 μm in a volume less than about 5% of the whole volume of yttrium oxide base powder.

The maximum particle diameter of the yttrium oxide base powder is usually less than 20 μm. When the yttrium oxide base powder contains coarse particles having a particle diameter of 20 μm or more, it is difficult to make the thickness of the yttrium oxide film uniform.

In addition, examples of the method for making the maximum particle diameter of the yttrium oxide base powder less than 20 μm include, for example, a method in which the yttrium oxide base powder or its raw material, namely, yttrium oxide powder, is sufficiently pulverized.

When the particle diameter of the yttrium oxide base powder is controlled in the present step, a mix ratio of the particulate portions and non-particulate portions in the yttrium oxide film can be controlled.

As a solvent in which the yttrium oxide base powder is dispersed, a relatively volatile organic solvent such as, for example, methyl alcohol or ethyl alcohol is used.

An yttrium oxide base powder content, namely, a slurry concentration, in the raw slurry is usually 30 to 80% by volume, and preferably 40 to 70% by volume.

When the slurry concentration is within a range of 30 to 80% by volume, the raw slurry is supplied smoothly to the slurry supply port with a suitable fluidity, thereby a stable amount of raw slurry is supplied to the combustion flame, and therefore the film thickness and composition of the yttrium oxide film easily become uniform.

<Supplying Raw Slurry to Combustion Flame>

As described above, the slurry supply port of the film deposition apparatus is usually provided so as to supply the raw slurry to a flank of the sprayed combustion flame. Further, the combustion flame has a high spraying speed.

Therefore, part of the yttrium oxide base powder in the raw slurry supplied from the slurry supply port to the flank of the combustion flame is usually sprayed with the combustion flame by getting inside the combustion flame, and the rest of the yttrium oxide base powder is sprayed while staying outside the combustion flame without contact with the combustion flame.

Further, even when the yttrium oxide base powder in the raw slurry is sprayed with the combustion flame by getting inside the combustion flame, how deep the yttrium oxide base powder in the raw slurry is supplied into the combustion flame varies depending on conditions such as the speed at which the raw slurry is supplied to the combustion flame.

According to the present invention, it is preferable that the yttrium oxide base powder in the raw slurry be supplied to a center portion of the combustion flame because the spraying speed of the yttrium oxide base powder in the combustion flame stabilizes to become less liable to vary and the temperature of the combustion flame becomes constant, and therefore to control texture of yttrium oxide in the particulate portions and non-particulate portions of the yttrium oxide film is easy.

Supplying the yttrium oxide base powder in the raw slurry to the center portion of the combustion flame here means that the yttrium oxide base powder in the raw slurry is supplied from the flank of the combustion flame up to the center portion. Further, the center portion of the combustion flame means a center portion of a cross section perpendicular to a spraying direction of the combustion flame sprayed from the combustion flame port.

On the other hand, when the yttrium oxide base powder in the raw slurry is supplied only to the flank of the combustion flame or an outer portion of the combustion flame without being supplied to the center portion of the combustion flame, the spraying speed of the yttrium oxide base powder in the combustion flame remains unstable to become liable to vary, the temperature of the combustion flame varies widely, and therefore it becomes difficult to control the texture of the yttrium oxide in the particulate portions and non-particulate portions of the yttrium oxide film.

The method for allowing the raw slurry to be supplied to the center portion of the combustion flame include, for example, a method in which an amount and speed of the raw slurry supplied to the combustion flame is regulated.

(Yttrium Oxide Base Powder Spraying Step)

The combustion flame and yttrium oxide base powder prepared in the previous step is sprayed toward the underlayer covering the surface of the base material from a nozzle of the film deposition apparatus. The nozzle controls the spraying conditions of the combustion flame and yttrium oxide base powder. The spraying conditions to be controlled include, for example, the spraying speed or the like of the yttrium oxide base powder.

The nozzle of the film deposition apparatus is usually provided so as to spray the combustion flame and yttrium oxide base powder in a lateral direction. The base material on which the underlayer is formed is usually arranged so that the surface of the underlayer covering the surface of the base material is positioned on an extension line of the laterally-oriented nozzle of the film deposition apparatus.

The yttrium oxide base powder spraying step is a step of spraying the yttrium oxide base powder in the combustion flame on the surface of the underlayer covering the surface of the base material at a spraying speed of 400 to 1000 m/sec.

<Spraying Speed>

When the spraying speed of the yttrium oxide base powder is 400 to 1000 m/sec, the yttrium oxide base powder is pulverized sufficiently at the time of collision of the yttrium oxide base powder with the underlayer covering the surface of the base material or with the yttrium oxide film, and therefore an yttrium oxide film having a high film density and an appropriate mixture ratio between cubic crystals and monoclinic crystals can be obtained.

The spraying speed of the yttrium oxide base powder here means the spraying speed of the yttrium oxide base powder at a nozzle tip of the film deposition apparatus.

As described above, in terms of crystal structure, the particles of the yttrium oxide base powder is usually made up of only cubic crystals at room temperature. However, the crystal structure of the yttrium oxide base powder tends to turn into monoclinic crystals by melting or the like when exposed to high temperatures at about the level of the combustion flame. For example, when a film is formed by the thermal spraying method using yttrium oxide base powder as raw material, most or all of the yttrium oxide in the obtained yttrium oxide film is changed into monoclinic crystals.

In contrast, since the present step uses the impact sintering process in which yttrium oxide base powder is sprayed at a high speed, that is, at the above-described speed, which is a speed equal to or higher than a critical speed at which yttrium oxide base powder starts to deposit on the surface of the underlayer covering the surface of the base material, or on the surface of the yttrium oxide film, the yttrium oxide base powder can be sprayed while keeping the yttrium oxide base powder mostly non-molten.

Therefore, the crystal structure of the yttrium oxide in the sprayed yttrium oxide base powder remains as chemically stable cubic crystals. Further, the crystal structure of part of the yttrium oxide constituting the yttrium oxide film obtained by deposition changes into monoclinic crystals under the influence of destructive heat resulting from the impact, but the crystal structure of the rest of the yttrium oxide remains as chemically stable cubic crystals. In this way, in the yttrium oxide film according to the present invention, cubic crystals and monoclinic crystals coexist at a moderate ratio, thus the film density and film strength increase.

On the other hand, when the spraying speed of the yttrium oxide base powder is less than 400 m/sec, since the yttrium oxide base powder has low collision energy, the yttrium oxide base powder is not pulverized sufficiently at the time of collision of the yttrium oxide base powder with the underlayer covering the surface of the base material or with the yttrium oxide film, and therefore it becomes difficult to obtain an yttrium oxide film having high film density and film strength.

Further, when the spraying speed of the yttrium oxide base powder exceeds 1000 m/sec, since the yttrium oxide base powder has high collision energy, there is a possibility that the yttrium oxide film is damaged by the blast effect of the yttrium oxide base powder itself and therefore cracks occur in the yttrium oxide film at the time of collision of the yttrium oxide base powder with the underlayer covering the surface of the base material or with the yttrium oxide film.

When the spraying speed of the yttrium oxide base powder is controlled in the present step, it is possible to control the mix ratio of the particulate portions and non-particulate portions in the yttrium oxide film as well as the mix ratio of cubic crystals and monoclinic crystals in the yttrium oxide film.

<Spraying Distance>

According to the present invention, a spraying distance between the tip portion of the nozzle and the surface of the underlayer covering the surface of the base material is usually 100 to 400 mm, and preferably 100 to 200 mm.

When the spraying distance is 100 to 400 mm, the sprayed particles of the yttrium oxide base powder are crushed by moderate impact strength at the time of collision of the yttrium oxide base powder to be sprayed with the underlayer covering the surface of the base material or with the yttrium oxide film, and therefore an yttrium oxide film in which the particulate portions and the non-particulate portions are moderately mixed and cubic crystals and monoclinic crystals coexist at a moderate ratio can be obtained.

On the other hand, when the spraying distance is less than 100 mm, the yttrium oxide base powder has so few opportunities of collision because of too short distance that the yttrium oxide base powder is not sufficiently crushed, and therefore it becomes difficult to obtain an yttrium oxide film in which the particulate portions and the non-particulate portions are moderately mixed and cubic crystals and monoclinic crystals coexist at a moderate ratio.

Further, when the spraying distance exceeds 400 mm, the impact strength becomes so weak because of too long distance that the yttrium oxide base powder is not sufficiently crushed, and therefore it becomes difficult to obtain an yttrium oxide film in which the particulate portions and the non-particulate portions are moderately mixed and cubic crystals and monoclinic crystals coexist at a moderate ratio.

<Film Thickness>

The film thickness of the yttrium oxide film obtained in the present step is usually 10 μm or more, preferably 10 to 200 μm, and more preferably 50 to 150 μm.

The reason why the film thickness of the yttrium oxide film obtained in the present step is usually 10 μm or more is the same as the reason why the film thickness of the yttrium oxide film for the component for a plasma processing apparatus according to the present invention is usually 10 μm or more, and therefore description thereof will be omitted.

(Effects of Component for Plasma Processing Apparatus and Method for Manufacturing Component for Plasma Processing Apparatus)

With the component for a plasma processing apparatus according to an embodiment and the component for a plasma processing apparatus obtained by the method for manufacturing a component for a plasma processing apparatus according to the embodiment, since the yttrium oxide film is formed on the surface of the underlayer comprising a metal oxide film having a thermal conductivity of 35 W/m·K or less using the impact sintering process which deposits the yttrium oxide base powder while keeping the yttrium oxide base powder mostly non-molten, flat-shaped molten particles are less liable to be generated, and therefore surface defects of the yttrium oxide film can be reduced.

Further, with the component for a plasma processing apparatus according to the embodiment and the component for a plasma processing apparatus obtained by the method for manufacturing a component for a plasma processing apparatus according to the embodiment, since the yttrium oxide film can be made dense and its surface can be made smooth, internal defects of the yttrium oxide film can be reduced. Moreover, the withstand voltage of the yttrium oxide film can be improved.

Furthermore, with the component for a plasma processing apparatus according to the embodiment and the component for a plasma processing apparatus obtained by the method for manufacturing a component for a plasma processing apparatus according to the embodiment, since the crystal structure of the yttrium oxide constituting the yttrium oxide film has high stability, chemical stability of the yttrium oxide film can be improved. Therefore, the yields of the component for a plasma processing apparatus are improved.

In this way, the yttrium oxide film in the component for a plasma processing apparatus according to the embodiment and in the component for a plasma processing apparatus obtained by the method for manufacturing a component for a plasma processing apparatus according to the embodiment has reduced surface defects and reduced internal defects and has high chemical stability. Therefore, the component for a plasma processing apparatus and the method for manufacturing the component for a plasma processing apparatus according to the embodiment stably and effectively suppress the generation of dust (particles) from the component for a plasma processing apparatus.

Further, the component for a plasma processing apparatus according to the embodiment and the component for a plasma processing apparatus obtained by the method for manufacturing a component for a plasma processing apparatus according to the embodiment reduce the frequency of cleaning of the plasma processing apparatus to thereby improve an availability factor of the plasma processing apparatus and thereby increase productivity.

Furthermore, with the component for a plasma processing apparatus according to the embodiment and the component for a plasma processing apparatus obtained by the method for manufacturing a component for a plasma processing apparatus according to the embodiment, a replacement frequency of the component for a plasma processing apparatus is decreased, and therefore the cost of the component for a plasma processing apparatus is reduced.

Further, the yields of the products such as thin films and elements become high which are created using a plasma processing apparatus having the component for a plasma processing apparatus according to the present embodiment and a plasma processing apparatus having a component for a plasma processing apparatus obtained by the method for manufacturing a component for a plasma processing apparatus according to the present embodiment.

(Effects of Method for Manufacturing Component for Plasma Etching Apparatus)

With the method for manufacturing a component for a plasma processing apparatus according to the embodiment, since the surface of the base material is covered by the underlayer having a low thermal conductivity and the yttrium oxide film is formed on the surface of the underlayer by the impact sintering process, the destructive heat is effectively utilized for the bonding of yttrium oxide particles, and therefore yields are improved.

EXAMPLES

Examples are shown below, but the present invention should not be interpreted by limiting to these examples.

Examples 1 to 17 and Comparative Examples 1 to 3

Base Material

An aluminum base material measuring 100 mm long×200 mm wide was prepared.

(Underlayers)

Underlayers each comprising a metal oxide film shown in Table 1 were respectively provided on the surface of the base material (Examples 1 to 17 and Comparative Examples 1 and 2) to create base materials with an underlayer. The underlayers were provided by an atmospheric plasma spraying method. Further, the surface roughness was adjusted as shown in Table 1 by polishing the underlayers after being sprayed. In addition, Comparative Example 3 is an experimental example in which an underlayer was not provided.

Production conditions and properties of the underlayers are shown in Table 1. In Table 1, the base powder "$Al_2O_3$+$ZrO_2$" for the underlayer in Example 15 is a mixture (average particle diameter of 29 μm) of 50% by mass of $Al_2O_3$ having an average particle diameter of 28 μm and 50% by mass of $ZrO_2$ having an average particle diameter of 33 μm. Further, the base powder "YZS" for the underlayer in Example 16 is $ZrO_2$ (yttrium stabilized zirconia) powder which contains 8% by mass of $Y_2O_3$, the powder having an average particle diameter of 35 μm. The base powder "YAG" for the underlayer in Example 17 is $Y_3Al_5O_{12}$ (yttrium/aluminum/garnet) powder having an average particle diameter of 33 μm.

TABLE 1

| | Underlayer | | | | | |
|---|---|---|---|---|---|---|
| | Material Powder | | | | | |
| | Composition | Average Particle Diameter (μm) | Thickness (μm) | Surface Roughness Ra (μm) | Film Density (%) | Thermal Conductivity (W/m · K) |
| Example 1 | $Y_2O_3$ | 37 | 70 | 3 | 86 | 19 |
| Example 2 | $Y_2O_3$ | 33 | 120 | 4 | 90 | 14 |
| Example 3 | $Y_2O_3$ | 26 | 250 | 5 | 94 | 17 |
| Example 4 | $CeO_2$ | 38 | 50 | 3 | 86 | 8 |
| Example 5 | $Dy_2O_3$ | 32 | 150 | 4 | 92 | 4 |
| Example 6 | $Dy_2O_3$ | 30 | 200 | 3 | 92 | 5 |
| Example 7 | $Al_2O_3$ | 27 | 100 | 3 | 95 | 28 |
| Example 8 | $ZrO_2$ | 31 | 90 | 3 | 92 | 30 |
| Example 9 | $NbO_2$ | 25 | 200 | 3 | 98 | 34 |
| Example 10 | $HfO_2$ | 29 | 290 | 4 | 90 | 30 |
| Example 11 | $Ta_2O_5$ | 32 | 280 | 5 | 89 | 28 |
| Example 12 | $La_2O_3$ | 33 | 100 | 5 | 90 | 10 |
| Example 13 | $Nd_2O_3$ | 28 | 40 | 4 | 92 | 12 |
| Example 14 | $Sm_2O_3$ | 27 | 90 | 3 | 93 | 15 |
| Example 15 | $Al_2O_3$ + $ZrO_2$*[1] | 29*[2] | 130 | 3 | 91 | 20 |
| Example 16 | YZS | 35 | 160 | 3 | 90 | 22 |

TABLE 1-continued

| | | Underlayer | | | | |
|---|---|---|---|---|---|---|
| | Material Powder | | | | | |
| | Composition | Average Particle Diameter (μm) | Thickness (μm) | Surface Roughness Ra (μm) | Film Density (%) | Thermal Conductivity (W/m · K) |
| Example 17 | YAG | 33 | 200 | 3 | 90 | 22 |
| Comparative Example 1 | Al$_2$O$_3$ | 25 | 100 | 3 | 99 | 40 |
| Comparative Example 2 | MgO | 25 | 100 | 3 | 98 | 39 |
| Comparative Example 3 | — | — | — | — | — | — |

*[1]Mixture of 50 mass parts of Al2O3 having average particle diameter of 28 μm and 50 mass parts of ZrO2 having average particle diameter of 30 μm
*[2]Average particle diameter of mixed powder (Preparation of Yttrium Oxide Raw Slurry)

Raw slurry of the composition shown in Table 1 was prepared by mixing base powder made of an oxide shown in Table 2 with ethyl alcohol as a solvent.

In addition, yttrium oxide base powder: being made of cubic crystals; having a purity of 99.99% by mass or more; and not containing coarse particles exceeding 20 μm as a result of sufficient pulverization and sieving was used in experimental examples.

(Creation of Yttrium Oxide Film)

Using a combustion flame type spraying apparatus (film deposition apparatus), the raw slurry was supplied to combustion flame under the supply conditions shown in Table 2 by an impact sintering process and the yttrium oxide base powder in the raw slurry was sprayed toward the surface of the underlayer of the base material with an underlayer under the spraying conditions shown in Table 2.

In addition, the raw slurry was supplied to the combustion flame using a method for supplying the raw slurry up to the center portion of the combustion flame (Examples 1 to 17).

In Examples 1 to 17, the yttrium oxide base powder in the combustion flame was sprayed while the yttrium oxide base powder was kept mostly non-molten and then deposited on the surface of the base material to form an yttrium oxide film. As a result, components for a plasma processing apparatus were obtained.

Comparative Examples 1 and 2 are experimental examples in which an underlayer having a thermal conductivity exceeding 35 W/m·K was provided as shown in Table 1. Further, Comparative Example 3 is an experimental example in which the underlayer was not provided.

The production conditions and properties of yttrium oxide films are shown in Table 2.

Peeling evaluation of the yttrium oxide film was conducted with respect to the components for a plasma processing apparatus in Examples 1 to 17 and Comparative Examples 1 to 3. The peeling evaluation was conducted by sticking an adhesive tape on the surface of the yttrium oxide film and then peeling the adhesive tape, thereafter conducting enlargement observation of the peeled tape surface by SEM to determine a measurement range of a unit area of 80 μm×60 μm, and evaluating an area ratio (%) calculated out by dividing an area where the yttrium oxide particles adhered within the measurement range by the whole area of the measurement range (4800 μm$^2$).

TABLE 2

| | Yttrium Oxide Film | | | | | | |
|---|---|---|---|---|---|---|---|
| | Material Powder | Material Slurry | | | | | |
| Sample No. | Average Particle Diameter (μm) | Ratio of Material Powder (vol. %) | Supply to Center of Combustion Flame | Spraying Speed (m/sec) | Spraying Distance (mm) | Thickness of Yttrium Oxide Film (μm) | Peeling Evaluation (%) |
| Example 1 | 1.5 | 50 | Yes | 500 | 130 | 30 | 0.52 |
| Example 2 | 2.0 | 60 | Yes | 600 | 150 | 120 | 0.44 |
| Example 3 | 3.0 | 70 | Yes | 900 | 180 | 180 | 0.38 |
| Example 4 | 4.0 | 40 | Yes | 800 | 340 | 70 | 0.49 |
| Example 5 | 5.0 | 50 | Yes | 600 | 280 | 50 | 0.43 |
| Example 6 | 2.5 | 30 | Yes | 450 | 300 | 90 | 0.41 |
| Example 7 | 1.5 | 55 | Yes | 400 | 100 | 50 | 0.55 |
| Example 8 | 2.0 | 45 | Yes | 500 | 200 | 80 | 0.57 |
| Example 9 | 2.5 | 65 | Yes | 550 | 200 | 100 | 0.58 |
| Example 10 | 3.0 | 50 | Yes | 600 | 300 | 110 | 0.53 |
| Example 11 | 1.5 | 50 | Yes | 700 | 300 | 100 | 0.52 |
| Example 12 | 1.5 | 55 | Yes | 500 | 200 | 100 | 0.48 |
| Example 13 | 2.0 | 55 | Yes | 800 | 380 | 180 | 0.50 |
| Example 14 | 2.5 | 60 | Yes | 600 | 280 | 150 | 0.50 |

TABLE 2-continued

| | Yttrium Oxide Film | | | | | | |
|---|---|---|---|---|---|---|---|
| | Material Powder | Material Slurry | | | | | |
| Sample No. | Average Particle Diameter (μm) | Ratio of Material Powder (vol. %) | Supply to Center of Combustion Flame | Spraying Speed (m/sec) | Spraying Distance (mm) | Thickness of Yttrium Oxide Film (μm) | Peeling Evaluation (%) |
| Example 15 | 2.0 | 60 | Yes | 600 | 250 | 130 | 0.51 |
| Example 16 | 2.0 | 50 | Yes | 800 | 300 | 100 | 0.51 |
| Example 17 | 2.0 | 50 | Yes | 1000 | 400 | 150 | 0.50 |
| Comparative Example 1 | 1.3 | 50 | Yes | 500 | 250 | 100 | 0.89 |
| Comparative Example 2 | 1.5 | 50 | Yes | 500 | 250 | 100 | 0.86 |
| Comparative Example 3 | 1.3 | 60 | Yes | 500 | 250 | 100 | 0.97 |

As understood from the Table 2, the peeling evaluation (%) was as good as 0.58% or less for the components for a plasma processing apparatus according to Examples 1 to 17 in which the metal oxide films each having a thermal conductivity of 35 W/m·K or less were respectively provided as an underlayer. This means that the film strength is high.

In contrast, the peeling evaluation was poor for Comparative Examples 1 and 2 in which underlayers each having a high thermal conductivity were respectively provided and Comparative Example 3 in which an underlayer was not provided even though the film deposition conditions in the impact sintering process were favorable.

(Evaluation of Yttrium Oxide Film for Component for Plasma Processing Apparatus)

With respect to the yttrium oxide films of the obtained components for a plasma processing apparatus, the film density, area coverage ratios of particulate portions (particles whose grain boundaries were observable) and non-particulate portions (particles whose grain boundaries were not observable), and average particle diameter of the particulate portions were measured.

<Film Density>

Regarding the film density, in the first place, an enlarged photograph at a magnification of 500 was taken so that the total unit area of a cross section of the film would be 200 μm×200 μm. Next, the proportion of a void area per unit area of the enlarged photograph was calculated out as a void ratio (%), and a value obtained by subtracting the void ratio (%) from 100% was designated as a film density (%).

<Area Coverage Ratios of Particulate Portions and Non-Particulate Portions>

An enlarged photograph covering a unit area of 20 μm×20 μm of the surface of the yttrium oxide film at a magnification of 5000 was taken. Then, each yttrium oxide particle whose grain boundary was visually identifiable was designated as a particle with an observable grain boundary (particulate portion) and each yttrium oxide particle whose grain boundary was not identifiable due to bonding was designated as a particle with a non-observable grain boundary (non-particulate portion), and the area coverage ratios of the particulate portions and non-particulate portions were determined. The total of the area coverage ratio of the particulate portions and area coverage ratio of the non-particulate portions is 100%.

The above procedures were carried out for arbitrary three locations on the surface of the yttrium oxide film, and the area coverage ratio of the particulate portions and area coverage ratio of the non-particulate portions were determined for each of the three locations. Furthermore, the average value of the area coverage ratios of the particulate portions at the three locations and the average value of the area coverage ratios of the non-particulate portions at the three locations were determined.

<Average Particle Diameter of Particulate Portions>

The average particle diameter of the particulate portions was measured using the enlarged photograph at a magnification of 5000 taken to calculate out the area coverage ratios of the particulate portions and non-particulate portions.

To begin with, the length of the line segment linking the most distant two points among line segments linking two arbitrary points set on the grain boundary of a particulate portion shown in the enlarged photograph at a magnification of 5000 was measured and the measured value was designated as the particle diameter of the particulate portion. Subsequently, the particle diameters of 20 particulate portions shown in the enlarged photograph at a magnification of 5000 were measured, and the arithmetic mean value of the particle diameters of the particulate portions was determined as the average particle diameter of the particulate portions.

<Strongest Peak Ratio (Im/Ic) of Yttrium Oxide Film>

The crystal structure of the surfaces of the yttrium oxide film was studied by conducting x-ray surface analysis under the conditions of using a Cu target at an x-ray tube voltage of 40 kV and an x-ray tube current of 40 mA.

Next, the strongest peak ratio (Im/Ic) was calculated out by dividing the peak value Im of the strongest peak of a monoclinic crystal by the peak value Ic of the strongest peak of a cubic crystal.

The strongest peak of a monoclinic crystal here means the peak with the largest peak value, of a plurality of peaks of the monoclinic crystal. The strongest peak of a cubic crystal means the peak with the largest peak value, of a plurality of peaks of the cubic crystal.

Measurement results are shown in Table 3, including those on the film density, area coverage ratios of the particulate portions and non-particulate portions, average particle diameter of the particulate portions, and the surface roughness Ra and Im/Ic ratio of the yttrium oxide films.

TABLE 3

| | | Yttrium Oxide Film | | | | |
|---|---|---|---|---|---|---|
| Sample No. | Film Density (%) | Area Coverage Ratio of Non-Particulate Portion (%) | Area Coverage Ratio of Particulate Portion (%) | Average Particle Diameter of Particulate Portion (μm) | Surface Roughness Ra (μm) | Strongest Peak Ratio Im/Ic |
| Example 1 | 99.9 | 97 | 3 | 1.2 | 2 | 0.5 |
| Example 2 | 99.9 | 100 | 0 | — | 1 | 0.5 |
| Example 3 | 99.9 | 100 | 0 | — | 1 | 0.6 |
| Example 4 | 99.7 | 98 | 2 | 3.7 | 1 | 0.5 |
| Example 5 | 99.9 | 100 | 0 | — | 2 | 0.4 |
| Example 6 | 99.1 | 95 | 5 | 2.1 | 2 | 0.5 |
| Example 7 | 99.3 | 97 | 3 | 1.3 | 1 | 0.5 |
| Example 8 | 99.0 | 85 | 15 | 1.7 | 2 | 0.5 |
| Example 9 | 99.0 | 88 | 12 | 2.1 | 2 | 0.5 |
| Example 10 | 99.5 | 96 | 4 | 2.5 | 3 | 0.5 |
| Example 11 | 99.4 | 96 | 4 | 1.3 | 1 | 0.5 |
| Example 12 | 99.6 | 95 | 5 | 1.2 | 1 | 0.5 |
| Example 13 | 99.8 | 99 | 1 | 1.7 | 1 | 0.5 |
| Example 14 | 99.7 | 98 | 2 | 2.2 | 3 | 0.5 |
| Example 15 | 99.7 | 98 | 2 | 1.7 | 1 | 0.5 |
| Example 16 | 99.9 | 100 | 0 | — | 1 | 0.4 |
| Example 17 | 99.9 | 100 | 0 | — | 1 | 0.4 |
| Comparative Example 1 | 98.2 | 77 | 23 | 1.2 | 4 | 0.3 |
| Comparative Example 2 | 98.3 | 75 | 25 | 1.3 | 5 | 0.3 |
| Comparative Example 3 | 95.8 | 72 | 28 | 1.1 | 4 | 0.3 |

As can be seen from the results shown in Table 3, with respect to the components for a plasma processing apparatus in Examples 1 to 17, it was found that the film density of the yttrium oxide film was high, the area coverage ratio of the particulate portions was in a range of 0 to 20%, and the area coverage ratio of the non-particulate portions was in a range of 80 to 100%.

Further, it was found that in the case of the components for a plasma etching apparatus in Examples 1 to 17, which were created using the impact sintering process, the average particle diameter of the particulate portions of the yttrium oxide film was smaller than the average particle diameter of the yttrium oxide base powder.

On the other hand, the area coverage ratio of the non-particulate portions was less than 80% in Comparative Examples 1 to 3.

Further, with respect to the components for a plasma etching apparatus in Examples 1 to 17, the surface roughness Ra (arithmetic average surface roughness) of the yttrium oxide film was 3 μm or less. Furthermore, the surface roughness Ra of the yttrium oxide film in Comparative Examples 1 to 3 was in a range of 4 to 5 μm. It is believed that this is because the small number of non-particulate portions resulted in growth of surface asperities.

FIG. 2 is a photograph showing a surface of an example of an yttrium oxide film for the component for a plasma processing apparatus in Example 1. As shown in FIG. 2, the yttrium oxide film 4 is formed from the particulate portions 5 and the non-particulate portions 6. In the components for a plasma processing apparatus according to Examples, the non-particulate portions where the grain boundary phase are not identifiable due to bonding of yttrium oxide particles account for 80% or more.

FIG. 3 is a photograph showing a cross section of an example of the component for a plasma processing apparatus in Example 1. As shown in FIG. 3, the underlayer 3 and the yttrium oxide film 4 are formed on the base material 2 in this, order, and voids 7 are formed in the underlayer 3. When the voids exist in the underlayer in such a way, they can be confirmed by an enlarged photograph.

(Etch Test of Component for Plasma Etching Apparatus)

The components for a plasma processing apparatus in respective Examples and Comparative Examples were arranged respectively in a plasma etching apparatus and exposed to an etching gas mixture of $CF_4$ (with a flow rate of 50 sccm), $O_2$ (with a flow rate of 20 sccm), and Ar (with a flow rate of 50 sccm).

The plasma etching apparatus was operated continuously for 5 hours setting the pressure in the etching chamber to 10 mTorr, the output power to 300 W, and the bias to 100 W to conduct plasma etching.

<Amount of Weight Reduction>

With respect to the yttrium oxide films for the components for a plasma etching apparatus, the weight before and after plasma etching was measured and the amounts of weight reduction caused by the plasma etching were measured.

<Withstand Voltage>

The withstand voltage was measured by a voltage tolerance test method in a fluorinert solution.

Specifically, the component for a plasma processing apparatus was put on a copper plate with an yttrium oxide-forming surface up, then the copper plate with the component being put thereon was immersed in a container filled with the fluorinert solution and thereafter left to stand for 1 minute after bubbles were not observed, and test voltage was applied between a probe electrode which was made to contact with the film deposition surface and the copper plate for 60 seconds to determine the voltage by which dielectric breakdown occurred.

The measurement results of the amount of weight reduction and the withstand voltage are shown in Table 4.

TABLE 4

| Sample No. | Amount of Weight Reduction due to Plasma Etching (μg/cm²) | Withstand Voltage (KV) |
|---|---|---|
| Example 1 | 8 | 7.5 |
| Example 2 | 6 | 8.0 |
| Example 3 | 5 | 8.5 |
| Example 4 | 9 | 7.0 |
| Example 5 | 7 | 7.5 |
| Example 6 | 6 | 8.0 |
| Example 7 | 9 | 7.5 |
| Example 8 | 10 | 7.0 |
| Example 9 | 10 | 7.0 |
| Example 10 | 8 | 8.0 |
| Example 11 | 8 | 8.0 |
| Example 12 | 8 | 8.0 |
| Example 13 | 7 | 8.0 |
| Example 14 | 8 | 8.0 |
| Example 15 | 8 | 8.0 |
| Example 16 | 6 | 8.0 |
| Example 17 | 6 | 8.0 |
| Comparative Example 1 | 13 | 6.0 |
| Comparative Example 2 | 13 | 6.0 |
| Comparative Example 3 | 15 | 5.0 |

As can be seen from the results shown in Table 4, it was found that the yttrium oxide films for the components for a plasma processing apparatus in Examples 1 to 17 had small amount of weight reduction and high resistance against plasma attacks and radical attacks. Therefore, it is believed that the generation of dust (particles) can effectively be suppressed when any of the components for a dry etching apparatus in examples 1 to 17 is used as a constituent member of a dry etching apparatus. Moreover, because of a high withstand voltage, the life span of components for a plasma processing apparatus is also prolonged.

While certain embodiments of the present inventions have been described, these embodiments have been presented by way of example only and are not intended to limit the scope of the inventions. Indeed, the novel embodiments described herein may be embodied in a variety of other forms, and furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

REFERENCE SIGNS LIST

1 Component for plasma processing apparatus
2 Base material
3 Underlayer
4 Yttrium oxide film
5 Particulate portion
6 Non-particulate Portion
7 Void (Pore)

The invention claimed is:

1. A component for a plasma processing apparatus, the component comprising:
    a base material;
    an underlayer covering a surface of the base material, and the underlayer comprising at least one selected from yttrium oxide, aluminum oxide, rare earth oxides, zirconium oxide, hafnium oxide, niobium oxide, and tantalum oxide; and
    an yttrium oxide film covering a surface of the underlayer, the yttrium oxide film being formed by spraying an unmolten yttrium oxide base powder at a surface of the underlayer, and by sintering and bonding the yttrium oxide base powder thereby to deposit the sintered and bonded particles on the underlayer,
    wherein the underlayer comprises a metal oxide film having a thermal conductivity of 35 W/m·K or less,
    the yttrium oxide film contains at least either particulate portions made of yttrium oxide or non-particulate portions made of yttrium oxide, the particulate portions being portions where a grain boundary demarcating an outer portion of the grain boundary is observed under a microscope, and the non-particulate portions being portions where the grain boundary is not observed under a microscope,
    the yttrium oxide film has a film thickness of 10 μm or more and a film density of 96% or more,
    the yttrium oxide film has a surface roughness of 3 μm or less in terms of arithmetic average surface roughness Ra, and
    the yttrium oxide film has a peak value ratio Im/Ic of 0.2 to 0.6, where a peak value of the strongest peak of a cubic crystal is denoted by Ic and a peak value of the strongest peak of a monoclinic crystal is denoted by Im, each obtained by XRD analysis, and
    wherein a surface of the yttrium oxide film has an area coverage ratio of the particulate portions that is 0 to 20% in an observation range of 20 μm×20 μm and an area coverage ratio of the non-particulate portions that is 80 to 100% in the observation range.

2. The component for a plasma processing apparatus according to claim 1, wherein the underlayer has a film density within a range of 85 to 98%.

3. The component for a plasma processing apparatus according to claim 1, wherein the underlayer has a film thickness within a range of 40 to 300 μm.

4. The component for a plasma processing apparatus according to claim 1, wherein the yttrium oxide film has a film thickness of 10 to 200 μm and a film density of 99 to 100%.

5. The component for a plasma processing apparatus according to claim 1, wherein the yttrium oxide film has an area coverage ratio of the non-particulate portions of the yttrium oxide film is 95 to 100%.

* * * * *